(12) United States Patent
Miyagi

(10) Patent No.: US 6,506,646 B1
(45) Date of Patent: Jan. 14, 2003

(54) METHOD FOR MANUFACTURING A SEMICONDUCTOR MEMORY

(75) Inventor: Susumu Miyagi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 40 days.

(21) Appl. No.: 09/671,211

(22) Filed: Sep. 28, 2000

(30) Foreign Application Priority Data

Jan. 25, 2000 (JP) ........................................ 2000-015406

(51) Int. Cl.[7] .............................................. H01L 21/336
(52) U.S. Cl. ........................ 438/257; 438/264; 438/289; 438/275
(58) Field of Search ................................ 438/257, 258, 438/266, 276, 770, 261, 275, 277, 262, 263, 264, 265, 289

(56) References Cited

U.S. PATENT DOCUMENTS

| | | | |
|---|---|---|---|
| 4,203,158 A | | 5/1980 | Frohman-Bentschkowsky et al. |
| 5,065,201 A | | 11/1991 | Yamauchi |
| 5,293,331 A | * | 3/1994 | Hart et al. .................... 365/185 |
| 5,359,218 A | * | 10/1994 | Taneda ......................... 257/321 |
| 5,501,996 A | * | 3/1996 | Yang et al. ..................... 437/43 |
| 5,514,607 A | * | 5/1996 | Taneda .......................... 437/43 |
| 5,756,385 A | * | 5/1998 | Yuan et al. .................. 438/258 |
| 5,801,414 A | * | 9/1998 | Shinmori ..................... 257/315 |
| 5,904,575 A | * | 5/1999 | Ishida et al. ................. 438/770 |
| 5,981,342 A | * | 11/1999 | Kakoschke et al. .......... 438/266 |
| 6,190,973 B1 | * | 2/2001 | Berg et al. ................... 438/275 |
| 6,218,699 B1 | * | 4/2001 | Kakoschke ................... 257/321 |
| 6,225,162 B1 | * | 5/2001 | Lin et al. ..................... 438/261 |
| 6,225,660 B1 | * | 5/2001 | Lui ............................. 257/318 |
| 6,255,163 B1 | * | 7/2001 | Zatelli et al. ................ 438/257 |
| 6,261,906 B1 | * | 7/2001 | Hsu et al. .................... 438/266 |
| 6,268,248 B1 | * | 7/2001 | Cremonesi et al. .......... 438/258 |

* cited by examiner

*Primary Examiner*—Matthew Smith
*Assistant Examiner*—Renzo N. Rocchegiani
(74) *Attorney, Agent, or Firm*—Volentine Francos, PLLC

(57) ABSTRACT

The method for manufacturing a Semiconductor Memory according to the present invention comprises a step for forming a gate insulator film on the surface of a semiconductor substrate; a step for forming a mask layer having a through-hole provided in the position where a tunnel window is to be formed, on top o said gate insulator film; a step for forming an impurity region in the vicinity of the surface of said semiconductor substrate by introducing an impurity using the mask layer; and a step for forming a tunnel insulator film on the surface of the semiconductor substrate, using a mask layer. In the present invention, the position in which the source is formed and the position in which the tunnel window is formed are determined by means of the position of the same through-hole. Therefore, the manufacturing error in the distance between the tunnel window and the source can be nullified.

5 Claims, 9 Drawing Sheets

METHOD FOR MANUFACTURING A SEMICONDUCTOR MEMORY

BACKGROUND OF THE INVENTION

1. Field of the Invention

The present invention relates to a method for manufacturing a Semiconductor Memory. The present invention is used, for example, in the manufacture of EEPROMs (Electronically Programmable Read Only Memories).

2. Description of Related Art

EEPROMs are a commonly known type of nonvolatile semiconductor memory. In the most generally known EEPROM, a single memory cell comprises a single memory transistor and a single selector transistor. A transistor with a floating gate is used as this memory transistor.

FIG. 1 is a circuit diagram showing an exemplary constitution of an EEPROM memory cell. The EEPROM shown in FIG. 1 is provided with the memory transistor 101 and the selector transistor 102. The source of the memory transistor 101 and the source of the selector transistor 102 are connected.

FIGS. 2A and 2B are conceptual diagrams of an exemplary constitution of the memory cell shown in FIG. 1. FIG. 2A is a plan diagram and FIG. 2B is a diagram of a section along the line A—A' in FIG. 2A.

As shown in FIGS. 2A and 2B, memory transistor 101 is provided with drain 202, source 203, gate oxide film 204, tunnel window 205, floating gate 206, ONO film 207 and controller gate 208. Drain 202 and source 203 are formed by doping an impurity such as arsenic into the surface of the silicon substrate 201. The tunnel window 205 is formed by exposing the surface of the source 203 through the removal, by etching, of part of the gate oxide film 204, and by forming a thin oxide film (in other words tunnel oxide film) 204a to permit the electric current to flow on this exposed surface.

In addition, as shown in FIGS. 2A and 2B, the selector transistor 102 is provided with drain 209, source 210, gate oxide film 211 and gate 212. The drain 209 and the source 210 are formed by doping an impurity such as phosphorus into the surface of the silicon substrate 201. The drain 209 and the source 210 respectively comprise shallow regions N⁻ and deep regions N⁻. In FIG. 2B, shallow region N⁻ is indicated by a broken line and deep region N⁺ by a solid line. Gate 212 is formed from polysilicon, for example.

To give an EEPROM a high degree of integration, it is necessary to make the dimensions of the memory cells small. To make the dimensions of the memory cells small, it is preferable to position the memory cells with high accuracy during manufacture. This is because, if the dimensions are made small even though positioning accuracy is low, the EEPROM yield declines owing to the influence of positioning offsets. It is preferable to specify the memory cell dimensions in a way that allows positioning offsets at the manufacturing stage. For example, if the design rule is 0.5 μm, the maximum value of the position offset of the layers in the photolithography process becomes 0.2 μm per layer. Therefore, in the EEPROM shown in FIG. 2A and FIG. 2B, if the source 203 and tunnel window 205 are formed by different photolithography processes, the corresponding positioning offset between source 203 and tunnel window 205 (in other words the manufacturing error which is the distance L1 shown in FIG. 2B) becomes at maximum 0.4 μm. In this case, the position and dimensions of the source 203 must be specified in such a way that a 0.4 μm error is allowed. For reasons such as this, increasing the degree of integration of an EEPROM requires technology for increasing the positioning accuracy at the time of manufacture.

In addition, when the tunnel window is formed, in the prior art, it was not possible to make the diameter L2 of the tunnel window (see FIG. 2B) smaller than the photolithography resolution limit. This becomes an impediment to increasing the integration of an EEPROM. Therefore, in order to increase the degree of integration of an EEPROM, it is desirable to be able to use a technique which allows a tunnel window to be made with a diameter which is smaller than the photolithography resolution limit.

SUMMARY OF THE INVENTION

One of the objects of the present invention is to eliminate the influence of a positioning offset in the photolithography process.

Another object of the present invention is to make the diameter of the tunnel window smaller than the photolithography resolution limit.

For this reason, the method for manufacturing a Semiconductor Memory to which the invention relates comprises steps of: forming a gate insulator film on the surface of a semiconductor substrate; forming a mask layer comprising through-holes at positions where tunnel windows are to be formed, on top of said gate insulator film; forming an impurity region in the vicinity of the surface of said semiconductor substrate by doping an impurity using the mask layer; and forming a tunnel insulator film on the surface of said semiconductor substrate, using the mask layer.

In the present invention, the position for forming the impurity introduced region and the position for forming the tunnel window are determined by means of the position of the same through-hole. Therefore the manufacturing error in the distance between the impurity introduced region and the tunnel window can be nullified.

In addition, in the present invention it is preferable if, before the step for forming an tunnel window, there is further provided a step for forming a side wall on the inner wall of the through-hole.

By forming a side wall on the surface of the inner wall of the through-hole, it is possible to make the diameter of the tunnel window smaller than the photolithography resolution limit.

BRIEF DESCRIPTION OF THE DRAWINGS

The other objects and merits of the present invention will be explained with reference to the appended figures given below.

DESCRIPTION OF THE PREFERRED EMBODIMENTS

Embodiments of the present invention will be explained below with reference to the figures. The size, configuration and relative arrangement of each component are indicated in the figures only generally to a degree necessary for understanding the present invention, and the various explanatory values below are indicated merely by way of example.
First Embodiment Firstly, a first embodiment of the present invention will be explained.

The manufacturing method for this embodiment is explained in FIGS. 3A to 3K.

Figure 3A:
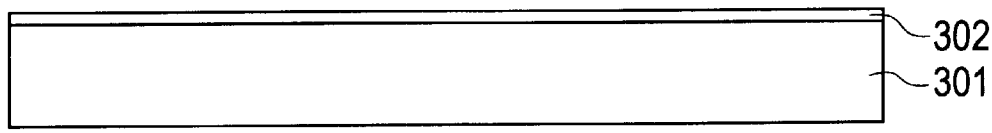
FIGS. 3A to 3K are sectional figures showing the process for manufacturing a first embodiment of a nonvolatile semiconductor memory.

(1) Firstly, an isolation region (not shown in the figures) is formed in silicon substrate 301 using, for example, a LOCOS (Local Oxidation of Silicon) method. Furthermore, as shown in FIG. 3A, oxide film 302 is formed on top of the silicon substrate 301.

Figure 3B:
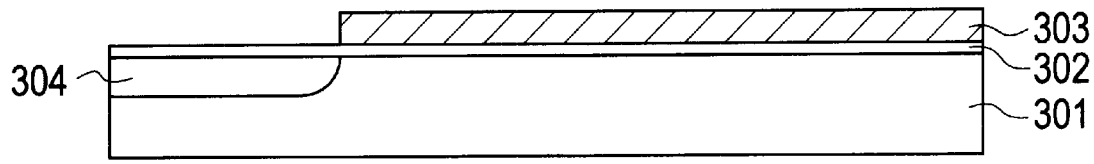

(2) Next, as shown in FIG. 3B, a resist pattern 303 is formed. Then, the memory transistor drain 304 is formed by injecting ions of arsenic or the like into the silicon substrate 301 using this resist pattern 303 as a mask.

Figure 3C:
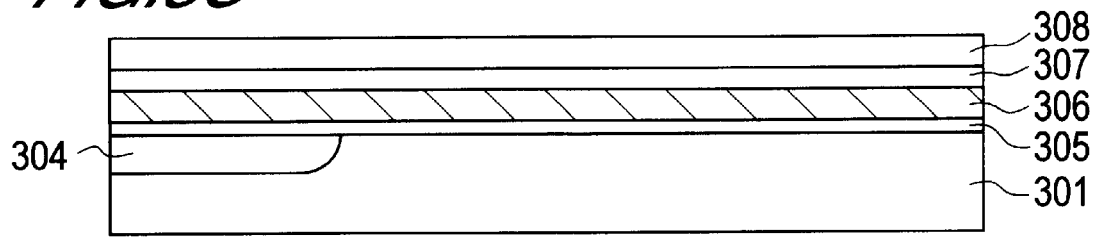

(3) The resist pattern 303 and oxide film 302 are removed, then, as shown in FIG. 3C, a gate oxide film 305, polysilicon film 306, silicon nitride 307 and prescribed CVD (Chemical Vapor Deposition) film 308 are successively formed. The polysilicon film 306 is used as the bottom layer of the floating gate. In addition, the silicon nitride film 307 is used as the stop film for the polysilicon in the process for forming the sidewall (see FIG. 3E) afterwards.

Figure 3D:
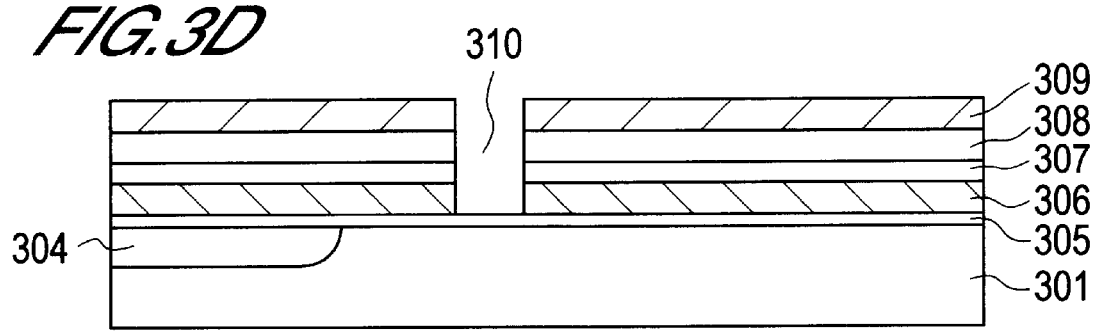

(4) Next, a resist pattern 309 is formed on the surface of the CVD film 308. Then, as shown in FIG. 3D, by etching using this resist pattern 309 as a mask, a through-hole 310 which passes through the polysilicon film 306, nitride film 307 and CVD film 308 is formed.

Figure 3E:
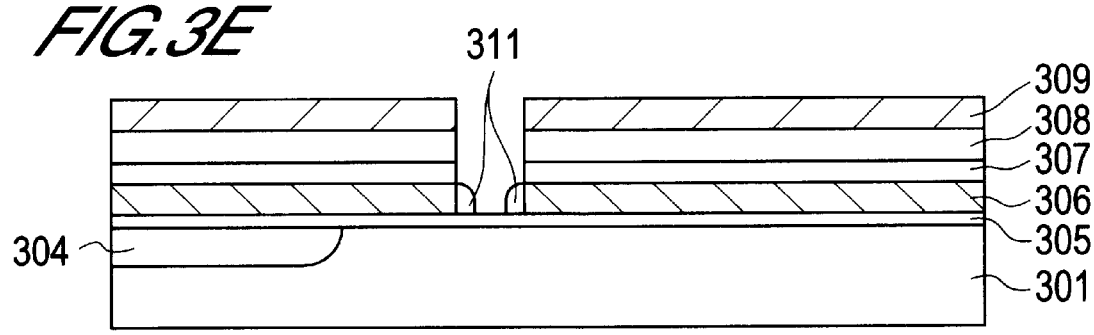
Figure 3F:
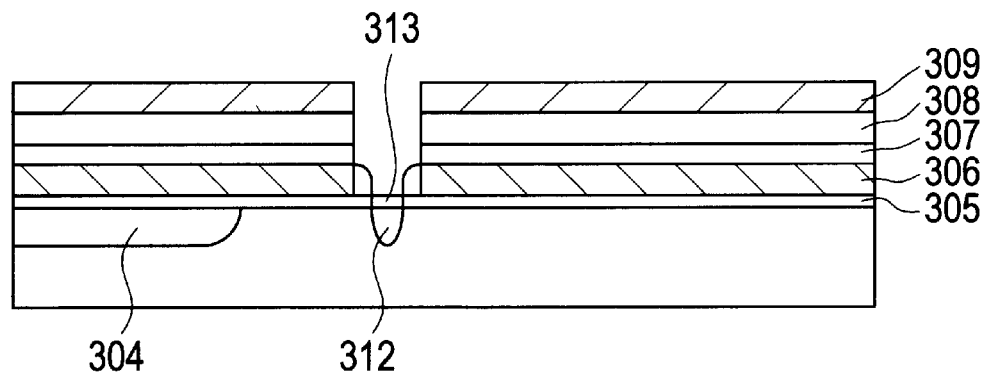
Figure 3G:
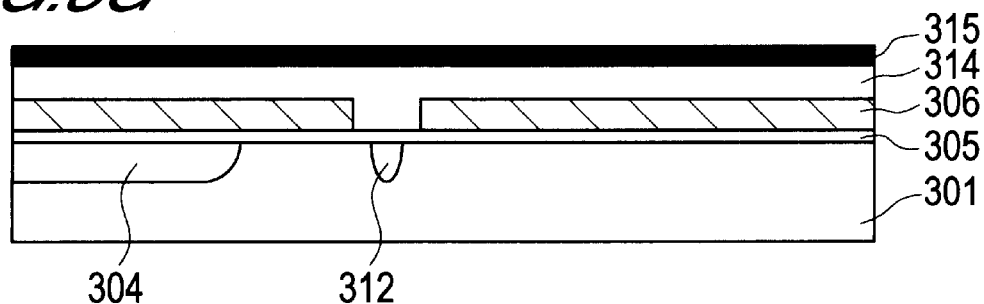

(5) After resist pattern 309 and CVD film 308 have been removed, a polysilicon side wall 311 is formed on the side face of the through-hole 310, as shown in FIG. 3E. The side wall 311 is formed using the deposition of polysilicon and the etching, for example. The thickness of the side wall 311 is determined by the thickness of the deposition and the conditions of the etching.

(6) Then, using the silicon nitride film 307 and the side wall 311 as the mask, the source 312 is formed by introducing an impurity such as arsenic into the surface of the silicon substrate 301. Next, using wet etching for example, the gate oxide film 305 exposed on the inside of the through-hole 310 is removed, and, in addition, a tunnel oxide layer 313 is formed (see FIG. 3F)

(7) The films 307-309 are removed and a polysilicon film 314 is formed as the top layer of the floating gate. Furthermore, an ONO film 315 is formed on the surface of this polysilicon film 314, using a thermal oxidization or CVD method or the like. The ONO film 315 is formed by stacking an oxide film, a nitride film and an oxide film (see FIG. 3G).

Figure 3H:
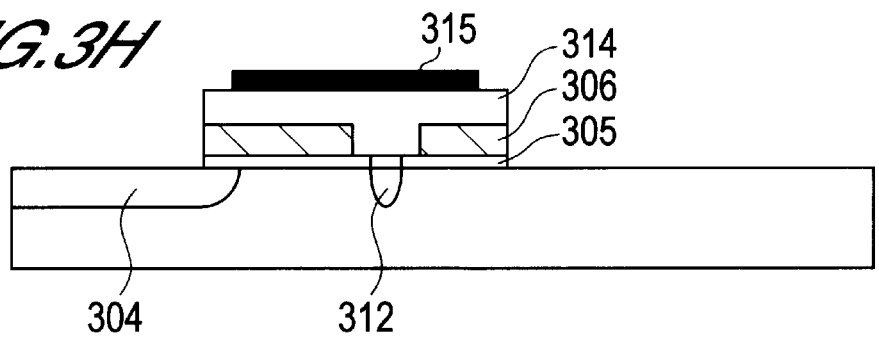

(8) Oxide film 305, polysilicon films 306, 314 and ONO film 315 are patterned using an ordinary resist pattern. As shown in FIG. 3H, this pattern is used to form a floating gate from polysilicon films 306, 314, and an insulator layer is formed from the ONO film 315, on top of this floating gate.

Figure 3I:
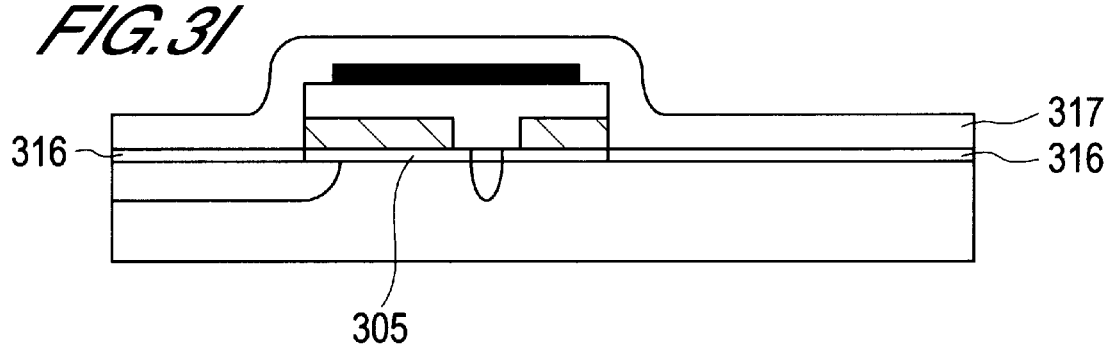

(9) As shown in FIG. 3I, an oxide film 316 is formed on the exposed surface of the substrate 301. Furthermore, as shown in FIG. 3I, a stacked film 317 which is formed by stacking polysilicon and tungsten silicide is formed over the entire surface, using the CVD method or some other deposition method.

Figure 3J:
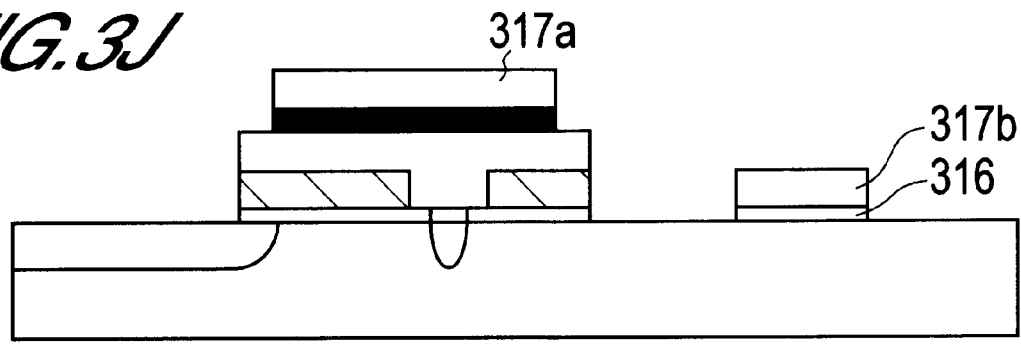

(10) As shown in FIG. 3J, the memory transistor control gate 317a and the selector transistor gate 317b are formed by patterning the stacked film 317, and the gate oxide film of the selector transistor is produced by patterning the oxide layer 316.

Figure 3K:
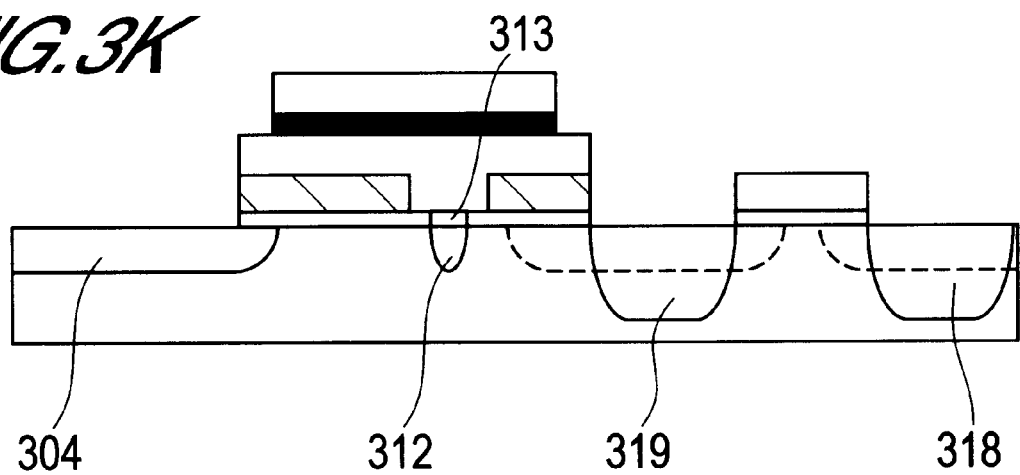

(11) Finally, as shown in FIG. 3K, the drain 318 and the source 319 of the selector transistor are produced by ion injection. The drain 318 and source 319 respectively comprise a shallow N⁻ region and deep N⁻ region. In FIG. 3K, the shallow N⁻ region is indicated by a broken line and the deep region N⁺ by a solid line.

Figure 1:
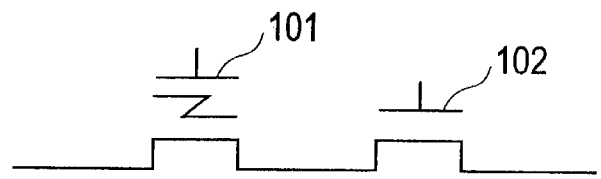
FIG. 1 is a circuit diagram showing an exemplary circuit constitution of a memory cell of an EEPROM.
Figure 2A:
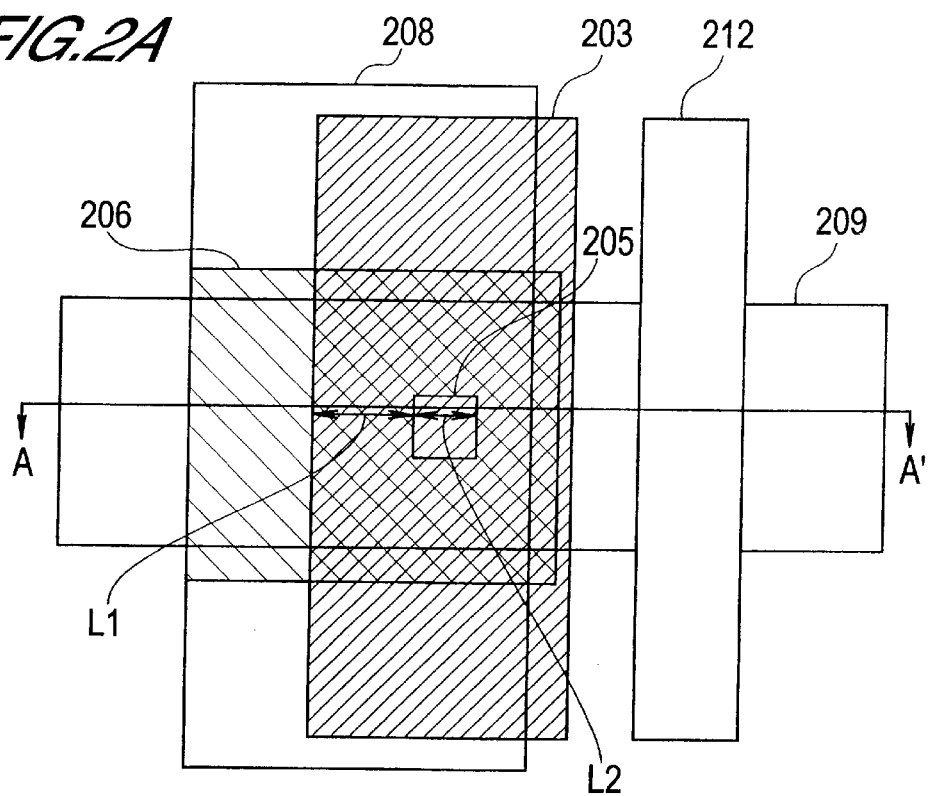
FIG. 2A is a plan diagram showing an exemplary circuit constitution of a memory cell of an EEPROM.
Figure 2B:
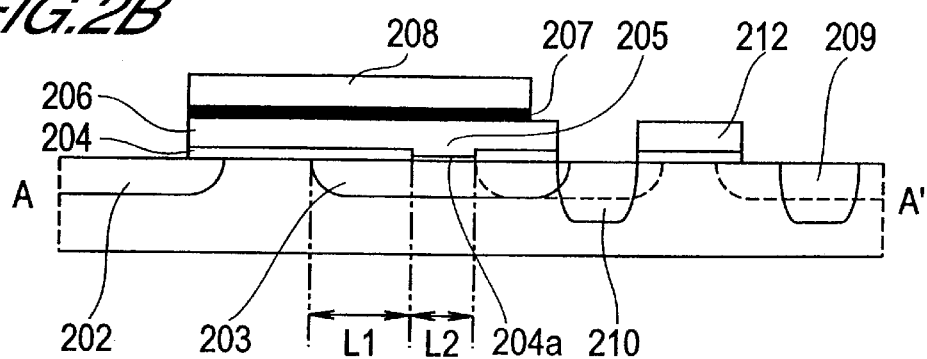
FIG. 2B is a sectional diagram of the section A—A' in FIG. 2A.

As mentioned above, in this embodiment, the position at which the source 312 is formed and the position at which the tunnel oxide layer 313 are formed are determined by means of the position of the through-hole 310 and the thickness of the side wall 311. Therefore, the manufacturing error in the distance between the tunnel oxide film 313 and the source 312 is nullified. For this reason, when determining the dimensions of the source 308, it is not necessary to include tolerances to deal with the manufacturing error, and therefore the degree of integration of an EEPROM can be increased. For example, if an EEPROM is designed using a 0.5 $\mu$m design rule, the dimensions of the source 312 can be made 0.4 $\mu$m smaller than the EEPROM constitution shown in FIGS. 2A and 2B.

In addition, in this embodiment, because the side wall 311 is formed inside the through-hole 310, the diameter of the tunnel window can be made smaller than the photolithography resolution limit. For example, if the diameter of the tunnel window is 0.6 $\mu$m when the side wall 311 is not formed, the diameter of the tunnel window can be reduced to about 0.3–0.4 $\mu$m by forming the side wall 311.
Second Embodiment Next, the second embodiment of the present invention will be explained.

This embodiment is an example in which the manufacturing error of the drain and tunnel window of the memory transistor is eliminated.

Figure 4A:
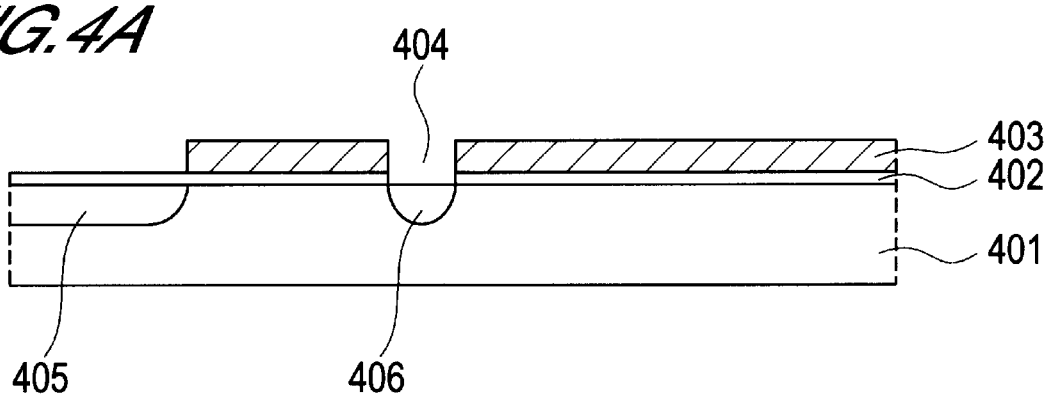
FIGS. 4A to 4C are sectional figures showing the process for manufacturing a second embodiment of a semiconductor memory.
Figure 4B:
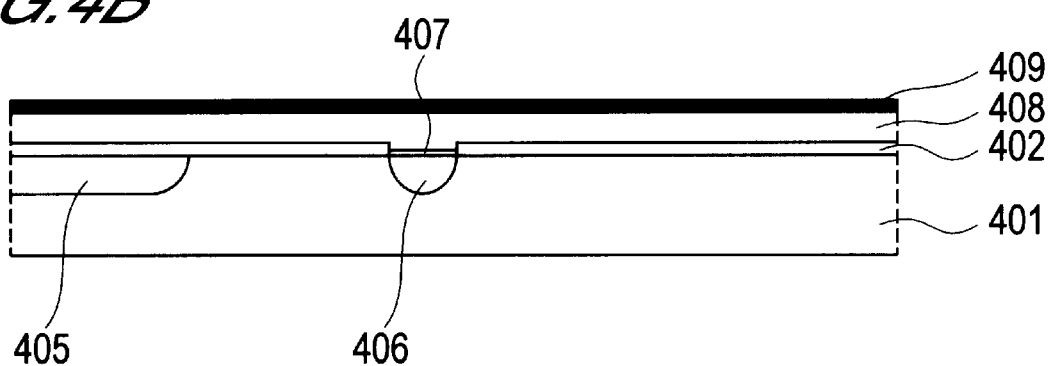
Figure 4C:
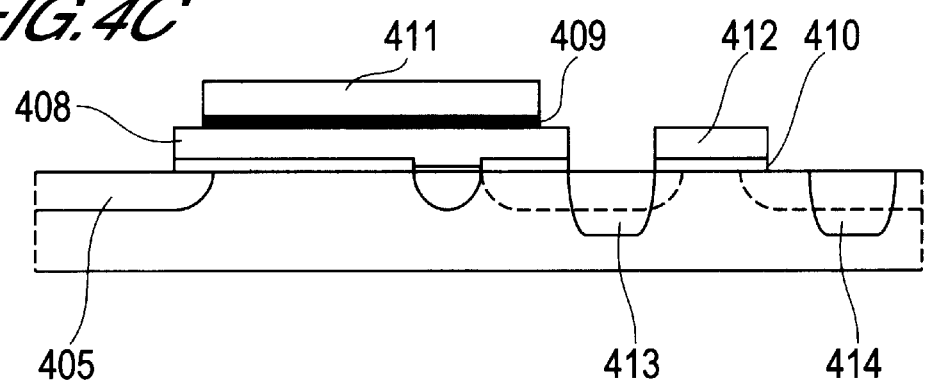

The manufacturing method for the second embodiment is explained using FIGS. 4A, 4B and 4C.

(1) Firstly, using a LOCOS method for example, an isolation region (not shown in the figures) is formed on the silicon substrate 401. Next, as shown in FIG. 4A, an oxide film 402 is formed on the surface of the silicon substrate 401, and a resist film 403 is formed on the surface of this oxide film 402. Then, using a photolithography technique, the part of the resist film 403 where the drain and the tunnel window are to be formed is etched. Next, drain 405 and source 406 are formed simultaneously by injecting ions of arsenic or the like into the silicon substrate 401 using this resist pattern 403 as a mask. After this, the gate oxide film 402 on the surface of the source 406 is removed.

(2) Next, as shown in FIG. 4B, a tunnel oxide film 407 is formed on the surface of th; source 406.

(3) Next, as shown in FIG. 4B, a polysilicon film 408 is formed on the surface of the oxide films 402, 407. Furthermore, an ONO film 409 is deposited on the surface of this polysilicon film 408, using a CVD (Chemical Vaper Deposition) method or the like.

(4) Oxide film 402, polysilicon film 408 and ONO film 409 are patterned using an ordinary resist pattern. As a result of this patterning, the polysilicon film 408 becomes a floating gate, and the ONO film 409 becomes an insulator film on top of the floating gate.

(5) Next, in the same way as in the first embodiment, gate oxide film 410 of the selector transistor is produced, and control gate 411 of the memory transistor and gate 412 of the selector transistor are formed.

(6) Finally, the source 413 and the drain 414 of the selector transistor, as shown in FIG. 4C, are manufactured by ion injection. The source 413 and drain 414 respectively have a shallow N⁻ region and deep N⁺ region. In FIG. 4C, the shallow N⁻ region is indicated by a broken line and the deep region N⁺ is indicated by a solid line.

As mentioned above, in this embodiment, for the same reason as in the first embodiment, it is possible to nullify the manufacturing error in the distance between the tunnel oxide film 407 and the source 406.

In addition, in this embodiment, the drain 405 and the source 406 are formed at the same time so that the manufacturing error in the distance between the tunnel window 404 and the drain 405 is also nullified. For this reason, when determining the dimensions of the drain 405, it is not necessary to include tolerances to deal with the manufacturing error. For example, if an EEPROM is designed using a 0.5 μm design rule, the dimensions of the drain 405 can be made 0.4 μm smaller than the EEPROM constitution shown in FIGS. 2A and 2B. In this regard, if the source and the drain are formed by different photolithography processes (see FIGS. 2A and 2B), a manufacturing disparity is produced in the distance between the source and the drain. For example, if the design rule is 0.5 μm, the positioning offset of each process becomes +/−0.2 μm so that the disparity or distance between the source and the drain becomes +/−0.4 μm.

For the above reasons, with this embodiment, it is possible to achieve an extremely high degree of integration of an EEPROM.

In this embodiment, no side wail is formed. By forming a side wall on the inside of the through-hole in the same way as in the first embodiment, the degree of integration of an EEPROM can be further increased in comparison with this embodiment of an EEPPOM.

Third Embodiment

Next, a third embodiment of the present invention will be explained.

This embodiment is an improvement of the first embodiment mentioned above.

In the first embodiment, in some cases when patterning the stacked film 317 (see FIG. 3J), filaments of stacked film 131 are left at the edges of the gate insulator film 305. Then, in some cases these filaments come away in the subsequent processes and cause short circuit in the wiring. In other words, these filaments become a cause of the reduction in the EEPROM manufacturing yield.

The factors causing these filaments to be produced will be explained in detail with reference to FIGS. 5A to 5D.

Figure 5A:
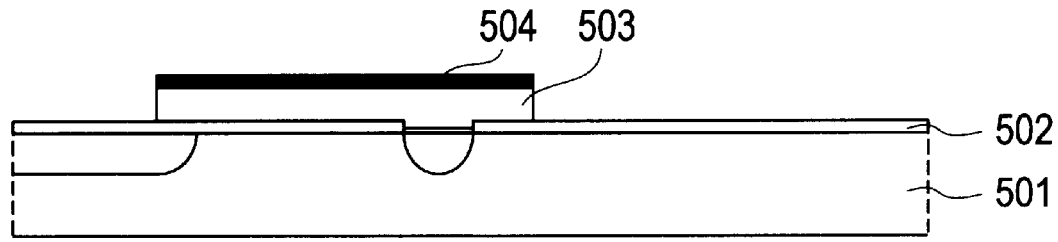
FIGS. 5A to 5D are manufacturing process diagrams explaining the points which the first embodiment is intended to improve.

FIG. 5A shows a state in which the floating gate 503 and the ONO 504 have been formed. In this state, the gate oxide film 502 on top of the silicon substrate 501 has not been patterned.

Figure 5B:
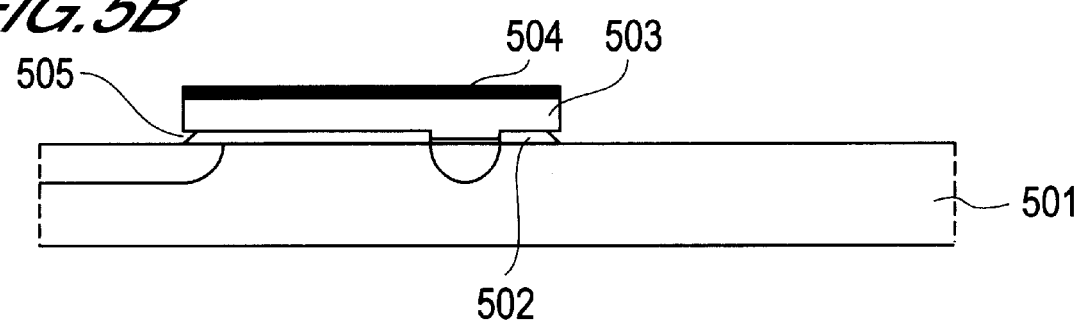

FIG. 5B shows the state after the patterning of gate oxide film 502 has occurred. It is possible to use isotropic etching for patterning the gate oxide film 502. However, if isotropic etching is used, not only is the exposed part of the gate oxide film 502 etched but also the inside wall part of the edge of floating gate 503. In this way, a gap 505 is formed between silicon substrate 501 and floating gate 503, as shown in FIG. 5B.

Figure 5C:
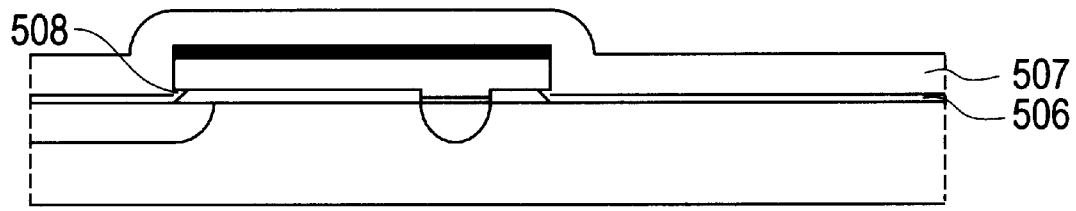

Next, the gate oxide film 506 and stacked film 507 of the selector transistor are formed on silicon substrate 501. FIG. 5C shows the state after films 506 and 507 have been formed. Gate oxide film 506 is extremely thin so that gap 505 is not filled thereby. Then, when stacked film 507 is formed, part 508 of the material forming this film 507 is deposited inside the gap 505.

Figure 5D:
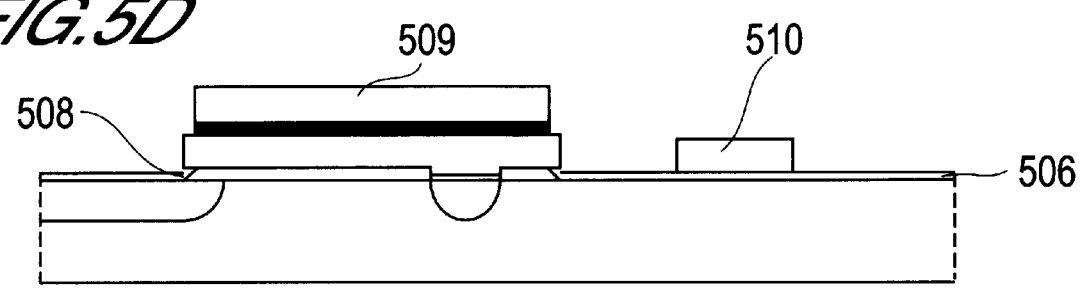

After this, as shown in FIG. 5D, the stacked film 507 is etched and the control gate 509 and gate 510 are formed. At this time, the material deposited 508 inside gap 505 is not removed completely and filaments are formed.

As mentioned, these filaments reduce the EEPROM manufacturing yield.

This drawback is eliminated by means of the manufacturing method of this embodiment.

The manufacturing method of this embodiment will be explained with reference to FIGS. 6A to 6H.

Figure 6A:
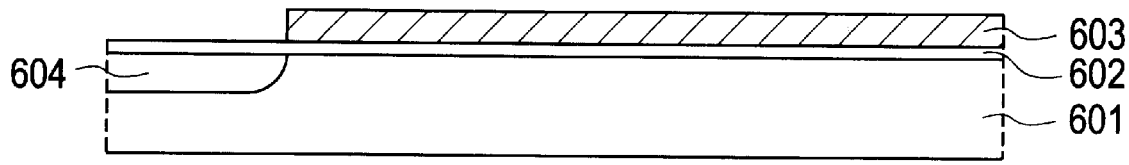
FIGS. 6A to 6H are sectional figures showing the process for manufacturing a third, embodiment of a semiconductor memory.

(1) Firstly, an isolation region (not shown in the figures) is formed in silicon substrate 601 using, for example, a LOCOS method. Furthermore, as shown in FIG. 6A, an oxide film 602 is formed on top of the silicon substrate 601, and then resist pattern 603 is formed on top of oxide film 602. Next, the memory transistor drain 604 is formed by injecting ions of arsenic or the like into the silicon substrate 601 using this resist pattern 603 as a mask.

Figure 6B:
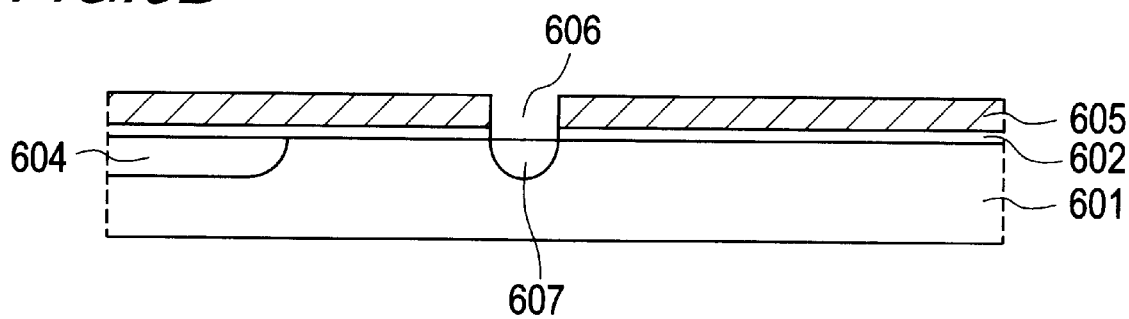

(2) Next, after this resist pattern 603 has been removed, a new resist pattern 605 is formed. Then, as shown in FIG. 6B, using a photolithography techniques, a part if resist film 605 and gate oxide film 602 in which a tunnel window is formed is etched. By means of this etching, a through-hole 606 is formed and therefore part of the surface of the silicon substrate 601 is exposed. The exposed surface becomes a tunnel window. After this, the source 607 is formed by introducing an impurity such as arsenic into the surface of the silicon substrate 601 using an ion injection technique.

Figure 6C:
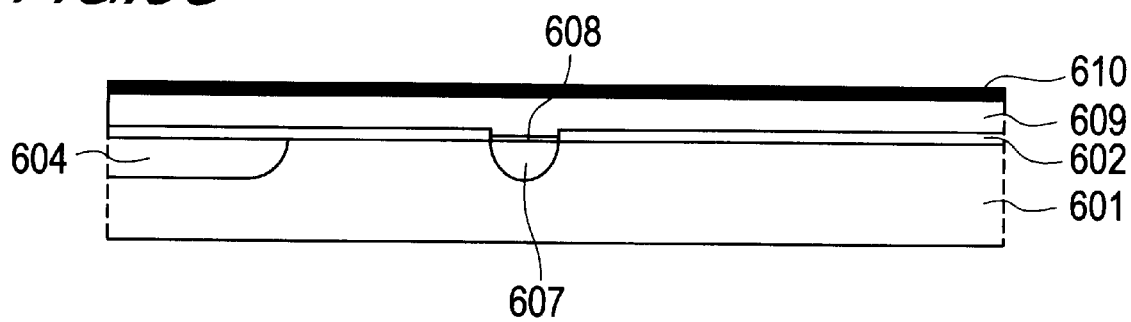

(3) Next, as shown in FIG. 6C, resist film 605 is removed and a tunnel oxide film 608 is formed on top of source 607, and then polysilicon film 609 and ONO film 610 are formed.

Figure 6D:
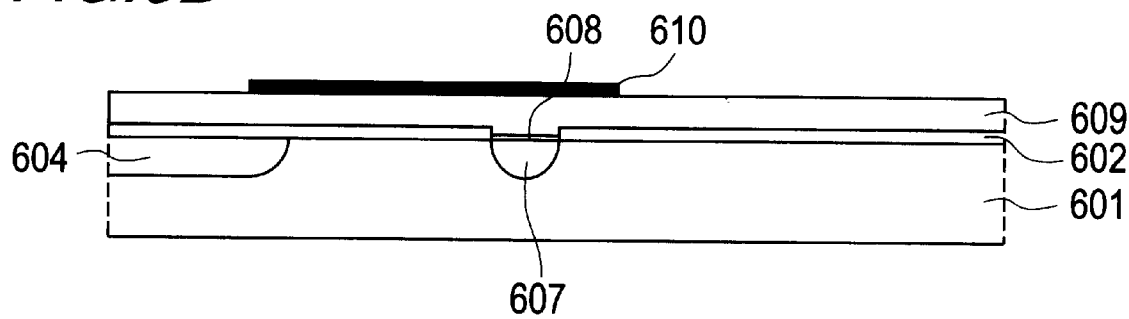

(4) Then, as shown in FIG. 6D, ONO film 610 is patterned using an ordinary photolithography technique.

Figure 6E:
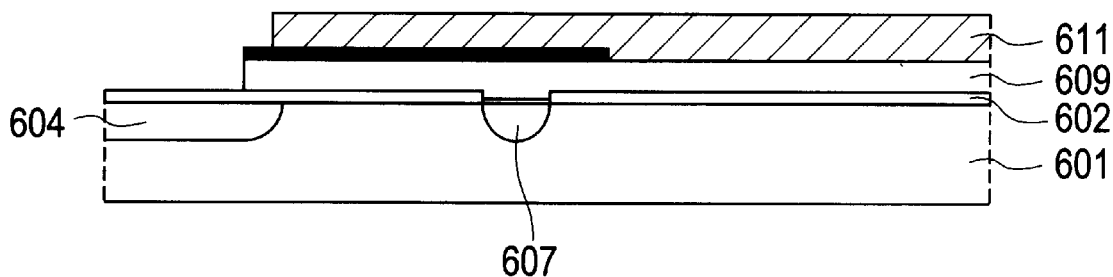

(5) A resist pattern 611 is formed so as to cover the region in which a selector transistor is to be formed and part of the ONO film 610. Then, as shown in FIG. 6E, polysilicon film 609 is etched using this resist pattern 611 and ONO film 610 as mask. After this, resist pattern 611 is removed.

Figure 6F:
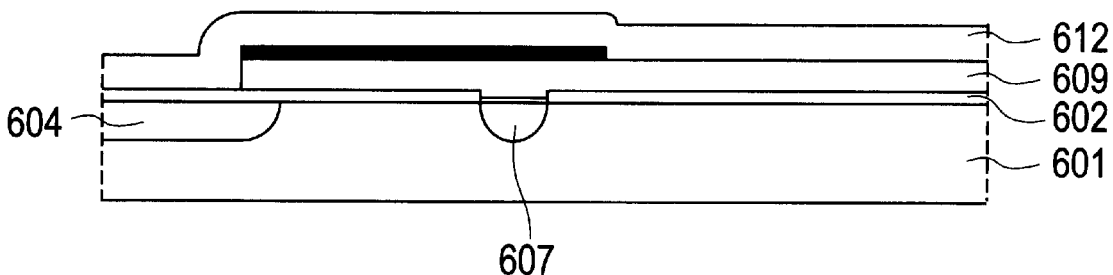

(6) As shown in FIG. 6F, a stacked film 612 which is formed by stacking polysilicon and tungsten silicide is formed using a CVD method or another deposition technique.

Figure 6G:
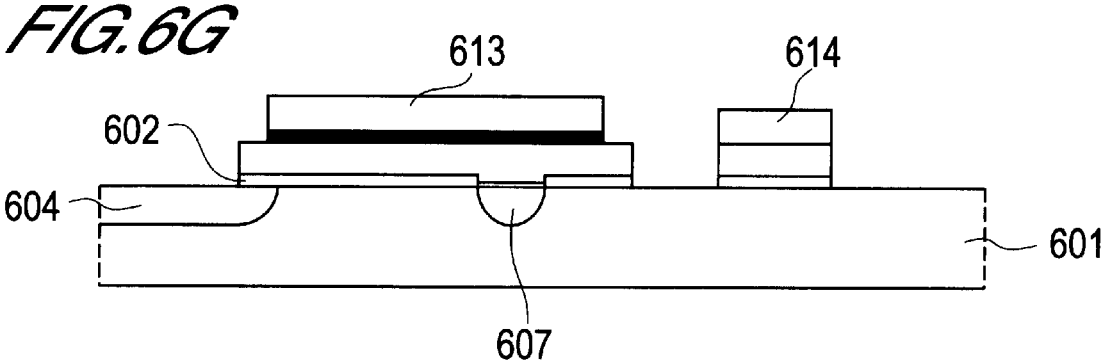

(7) As shown in FIG. 6G, by patterning stacked film 612 and by patterning polysilicon film 609, memory transistor control gate 613 and selector transistor gate 614 are formed. In this patterning, the gate 614 is formed in such a way that it becomes smaller than the control gate 613. After this, the patterning of the gate oxide film 602 is carried out.

Figure 6H:
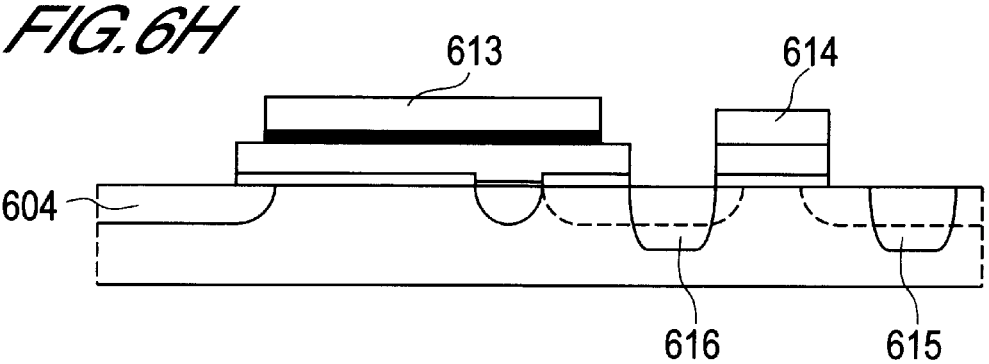

(8) Finally, as shown in FIG. 6H, the drain 615 and source 616 of the selector transistor are manufactured by means of ion injection.

As mentioned above, in this embodiment, because the patterning of the insulator film 602 is carried out after the control gate 613 has been formed, he filament 503 (see FIG. 5D) mentioned above is not formed. Therefore, this embodiment can improve the EEPROM manufacturing yield.

In addition, in this embodiment, for the same reason as in the case of the first embodiment mentioned above, it is possible to nullify the manufacturing error in the distance between the tunnel window 606 and the source 607.

A side wall is not formed in this embodiment. By forming a side wall on the inside of the through-hole, in the same way as in the first embodiment, the degree of integration of an EEPROM can be further increased in comparison with this embodiment of an EEPROM.

Fourth Embodiment

Next, a fourth embodiment of the present invention will be explained.

This embodiment is an improvement of the abovementioned second embodiment.

In the second embodiment, when control gate 411 is formed by patterning, in some cases, filaments of stacked film are left at the edges of the gate insulator film 402. Then, in some cases these filaments come away in the subsequent processes and cause short circuit in the wiring. In other words, these filaments become a cause of the reduction in the EEPROM manufacturing yield.

This drawback is eliminated by means of the manufacturing method according to this embodiment.

The manufacturing method of this embodiment will be explained with reference to FIGS. 7A to 7F.

Figure 7A:
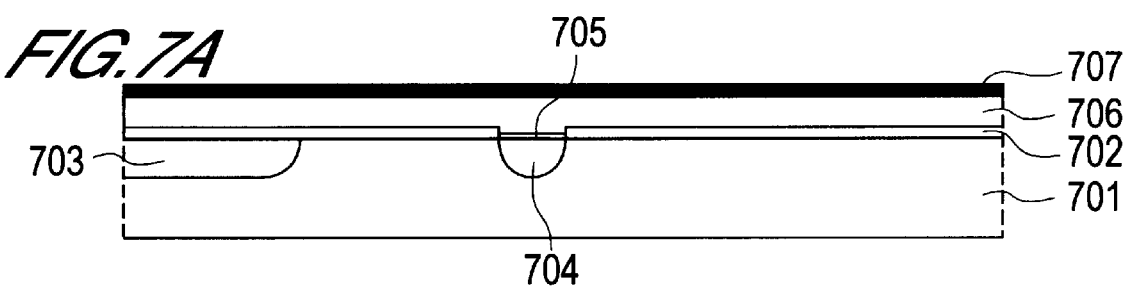
FIGS. 7A to 7F are sectional figures showing the process for manufacturing a fourth embodiment of a semiconductor memory.

(1) Firstly, an isolation region (not shown in the figures) is formed in silicon substrate 701 using, for example, a LOCOS method. Next, as shown in FIG. 7A, oxide film 702 is formed on the surface of the silicon substrate 701. Then, in the same way as in the second embodiment, the drain 703 and the source 704 are formed simultaneously. Furthermore, as shown in FIG. 7A, tunnel oxide film 705 is formed on top of the source 704, and next, in the same way as in the second embodiment, polysilicon film 706 land ONO film 707 are formed on the surface of the gate films 702, 705.

Figure 7B:
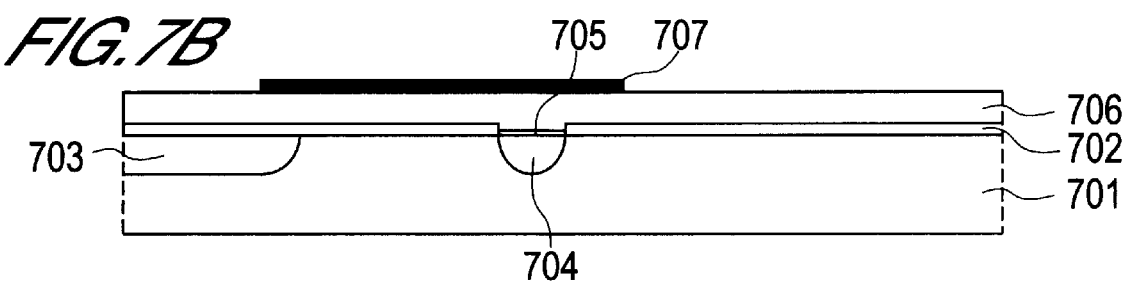

(2) Then, as shown in FIG. 7B, ONO film 707 is patterned using an ordinary photolithography technique.

Figure 7C:
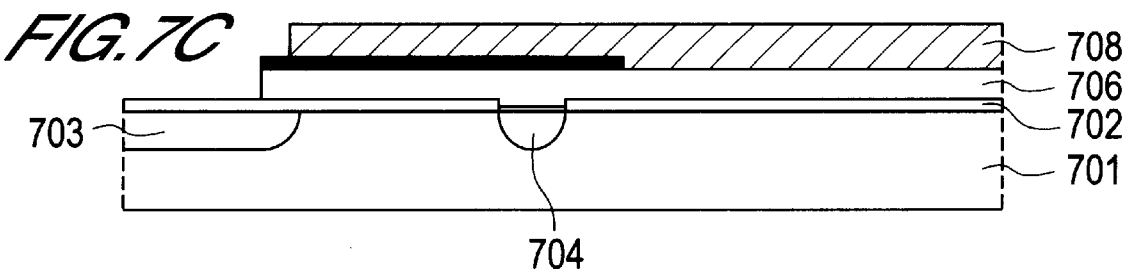

(3) A resist pattern 708 is formed so as to cover the region in which the selector transistor is to be formed and part of the ONO film 707. Then, as shown in FIG. 7C, polysilicon film 706 is etched using this resist pattern 708 and ONO 707 as mask. After this, resist pattern 708 is removed.

Figure 7D:
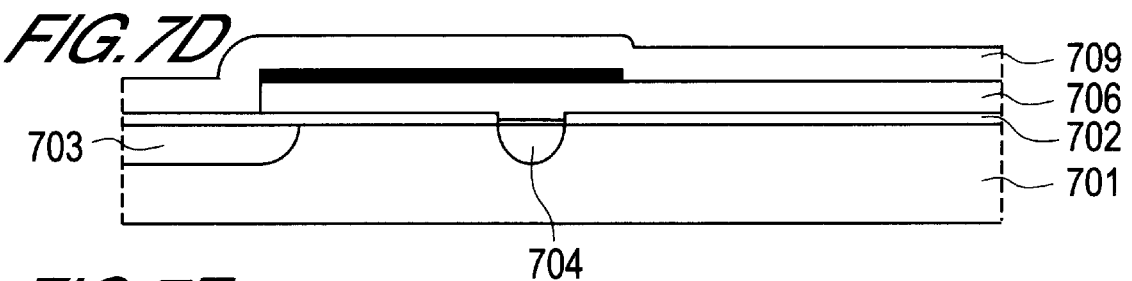

(4) As shown in FIG. 7D, a stacked film 709 which is formed by stacking polysilicon and tungsten silicide is formed using a CVD method or another deposition technique.

Figure 7E:
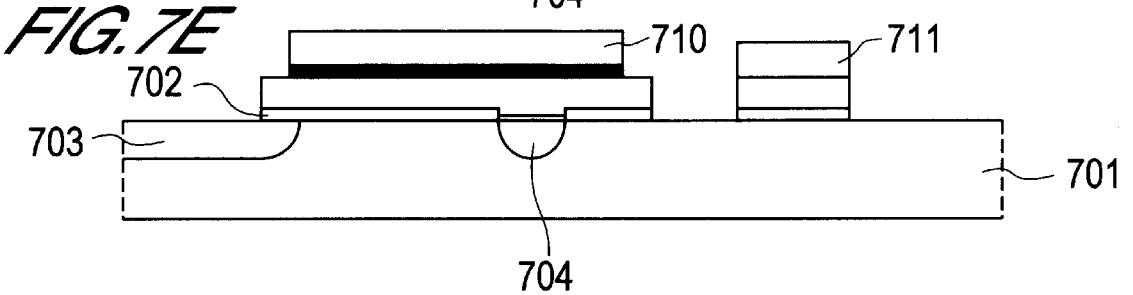

(5) As shown in FIG. 7E, by patterning the stacked film 709 and by patterning the polysilicon film 706, memory transistor control gate 710 and selector transistor gate 711 are formed. In this patterning, the gate 711 is formed in such a way that it becomes smaller than the control gate 711. After this, the patterning of the gate oxide film 702 is carried out.

Figure 7F:
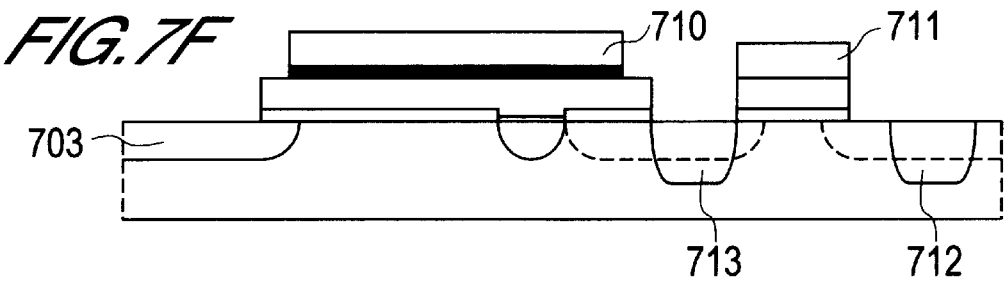

(6) Finally, as shown in FIG. 7F, the drain 712 and source 713 of the selector transistor are manufactured by means of ion injection.

As mentioned above, in this embodiment, because the patterning of the insulator film 702 is carried out after the control gate 710 has been formed, the filament mentioned above is not formed. Therefore, it is possible to improve the EEPROM manufacturing yield with this embodiment.

In addition, in this embodiment, for the same reason as that mentioned above in the first embodiment, it is possible to nullify the manufacturing error in the distance between the tunnel oxide film 705 and the source 704.

Furthermore, in this embodiment, for the same reason as that mentioned in the second embodiment, it is possible to nullify the manufacturing error in the distance between the tunnel oxide film 705 and the drain 703.

A side wall is not formed in this embodiment. By forming a side wall on the inside of the through-hole, in the same way as in the first embodiment, the degree of integration of an EEPROM can be further increased in comparison with this embodiment of an EEPROM.

What is claimed is:

1. A method of manufacturing a semiconductor device, comprising:

forming a gate insulator film on a surface of a semiconductor substrate;

forming a drain region near a top surface of the semiconductor substrate;

forming a mask structure on the gate insulating film including an area covering the drain region, the mask structure including a stop film and further including a through hole exposing an area of the gate insulating film;

forming side walls in the through hole, the side walls extending from the gate insulating film up to the stop film, but not extending to a top of the through hole;

using the mask structure and the side walls as a mask, doping an impurity into a portion of the substrate beneath the through hole to form a source region;

removing at least a portion of the exposed area of the gate insulating film;

forming a tunnel insulator film where the portion of the exposed area of the gate insulating film was removed; and forming a gate structure above the gate insulating film.

2. The method of claim 1, wherein the stop film includes silicon nitride.

3. The method of claim 1, wherein the mask structure includes a polysilicon film beneath the stop film.

4. The method of claim 1, wherein the side walls comprise polysilicon.

5. The method of claim 1, further comprising removing at least one layer of the mask structure prior to completing formation of the gate structure.

* * * * *